(12) United States Patent
Briggs et al.

(10) Patent No.: US 10,229,851 B2
(45) Date of Patent: Mar. 12, 2019

(54) SELF-FORMING BARRIER FOR USE IN AIR GAP FORMATION

(71) Applicant: International Business Machines Corporation, Armonk, NY (US)

(72) Inventors: Benjamin D. Briggs, Waterford, NY (US); Elbert Huang, Carmel, NY (US); Takeshi Nogami, Schenectady, NY (US); Christopher J. Penny, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/251,797

(22) Filed: Aug. 30, 2016

(65) Prior Publication Data

US 2018/0061708 A1   Mar. 1, 2018

(51) Int. Cl.
| | |
|---|---|
| *H01L 21/768* | (2006.01) |
| *H01L 21/321* | (2006.01) |
| *H01L 21/3215* | (2006.01) |
| *H01L 21/3115* | (2006.01) |
| *H01L 23/532* | (2006.01) |
| *H01L 23/522* | (2006.01) |

(52) U.S. Cl.
CPC .... *H01L 21/76883* (2013.01); *H01L 21/3115* (2013.01); *H01L 21/321* (2013.01); *H01L 21/3215* (2013.01); *H01L 21/7682* (2013.01); *H01L 21/76831* (2013.01); *H01L 21/76834* (2013.01); *H01L 21/76843* (2013.01); *H01L 21/76864* (2013.01); *H01L 23/53209* (2013.01); *H01L 23/53238* (2013.01); *H01L 23/53266* (2013.01); *H01L 23/53295* (2013.01); *H01L 23/5222* (2013.01)

(58) Field of Classification Search
CPC ......... H01L 21/76883; H01L 21/76864; H01L 21/76834; H01L 23/53209; H01L 21/76831; H01L 23/53266; H01L 21/76843; H01L 21/7682; H01L 21/3215; H01L 21/321; H01L 21/3115
See application file for complete search history.

(56) References Cited

U.S. PATENT DOCUMENTS

| | | | |
|---|---|---|---|
| 7,304,384 B2 | 12/2007 | Koike et al. | |
| 7,932,176 B2 | 4/2011 | Gordon et al. | |
| 8,013,445 B2 | 9/2011 | Lee et al. | |
| 8,222,134 B2 | 7/2012 | Gordon et al. | |
| 8,569,165 B2 | 10/2013 | Gordon et al. | |

(Continued)

*Primary Examiner* — Latanya N Crawford
(74) *Attorney, Agent, or Firm* — Cantor Colburn LLP; Vazken Alexanian

(57) ABSTRACT

An etch back air gap (EBAG) process is provided. The EBAG process includes forming an initial structure that includes a dielectric layer disposed on a substrate and a liner disposed to line a trench defined in the dielectric layer. The process further includes impregnating a metallic interconnect material with dopant materials, filling a remainder of the trench with the impregnated metallic interconnect materials to form an intermediate structure and drive-out annealing of the intermediate structure. The drive-out annealing of the intermediate structure serves to drive the dopant materials out of the impregnated metallic interconnect materials and thereby forms a chemical- and plasma-attack immune material.

14 Claims, 5 Drawing Sheets

(56) References Cited

U.S. PATENT DOCUMENTS

| | | |
|---|---|---|
| 9,112,005 B2 | 8/2015 | Gordon et al. |
| 9,349,687 B1 * | 5/2016 | Gates ................. H01L 23/53223 |
| 9,368,362 B2 * | 6/2016 | Rha ....................... H01L 21/306 |
| 9,711,453 B2 * | 7/2017 | Rha ....................... H01L 21/306 |
| 2009/0096102 A1 | 4/2009 | Gambino et al. |
| 2011/0254164 A1 | 10/2011 | Gordon et al. |
| 2012/0248608 A1 * | 10/2012 | Yoo ................... H01L 23/53238 |
| | | 257/751 |
| 2015/0004784 A1 * | 1/2015 | Yokoyama ........ H01L 21/76877 |
| | | 438/653 |
| 2016/0093566 A1 * | 3/2016 | Ting ................... H01L 23/5226 |
| | | 257/774 |
| 2017/0092589 A1 * | 3/2017 | Chen ................ H01L 23/53238 |
| 2017/0278797 A1 * | 9/2017 | Rha ................... H01L 21/76802 |
| 2017/0345752 A1 * | 11/2017 | Zhang ............... H01L 23/5226 |
| 2017/0345766 A1 * | 11/2017 | Zhang ............... H01L 23/53252 |

* cited by examiner

SELF-FORMING BARRIER FOR USE IN AIR GAP FORMATION

BACKGROUND

The present invention relates to semiconductor devices and, more specifically, to a self-forming barrier for use in air gap formation.

In semiconductor device manufacturing, integrated circuits (ICs) often use copper for interconnections in metallization layers. Such use of copper allows for the development of smaller metal components, reduced energy usage and higher-performance processors. To reduce interconnect resistively/capacitance (R/C) in smaller scale semiconductor devices, air gaps have been designed into such devices to reduce capacitance.

SUMMARY

According to a non-limiting embodiment of the present invention, an etch back air gap (EBAG) process is provided. The EBAG process includes forming an initial structure that includes a dielectric layer disposed on a substrate and a liner disposed to line a trench defined in the dielectric layer, impregnating a metallic interconnect material with dopant materials, filling a remainder of the trench with the impregnated metallic interconnect materials to form an intermediate structure and drive-out annealing of the intermediate structure. The drive-out annealing of the intermediate structure serves to drive the dopant materials out of the impregnated metallic interconnect materials and form a chemical- and plasma-attack immune material.

According to another non-limiting embodiment, an etch back air gap (EBAG) process is provided. The EBAG process includes forming an initial structure that includes a dielectric layer, which is disposed on a substrate and which is formed to define a trench, lining the trench with dopant materials, lining the dopant materials with a liner and filling a remainder of the trench. The filling of the remainder of the trench is conducted using metallic interconnect materials to form an intermediate structure.

According to another non-limiting embodiment, an etch back air gap (EBAG) process is provided. The EBAG process includes forming an initial structure that includes a dielectric layer, which is disposed on a substrate and which is formed to define a trench, lining the trench with a liner and lining the liner with dopant materials. The EBAG process further includes filling a remainder of the trench with metallic interconnect materials to form an intermediate structure and drive-out annealing of the intermediate structure. The drive-out annealing of the intermediate structure serves to drive the dopant materials through the liner.

According to another non-limiting embodiment, a semi-conductor device is provided. The semi-conductor device includes a dielectric layer having a first portion defining an empty region and a second portion defining a trench, first and second interconnects disposed within the empty region in the first portion and in the trench in the second portion, a self-forming layer and a capping layer. Each of the first and second interconnects includes metallic interconnect material and a liner disposed to surround portions of the metallic interconnect material. The self-forming layer, which is formed of chemical- and plasma-attack immune material, is disposed on surfaces of the first and second interconnects in the first and second portions and on surfaces of the dielectric layer in the first portion. The capping layer is disposed on the dielectric layer to define air gaps with the self-forming layer in the first portion.

According to yet another non-limiting embodiment, a semi-conductor device is provided. The semi-conductor device includes a dielectric layer, interconnects disposed over the dielectric layer, a self-forming layer and a capping layer. Each interconnect includes metallic interconnect material and a liner disposed to surround portions of the metallic interconnect material. The self-forming layer, which is formed of chemical- and plasma-attack immune material, is disposed on surfaces of the interconnects and the dielectric layer. The capping layer is disposed over the interconnects to define air gaps with the self-forming layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-15 are a series of views illustrating a process of forming an etch back air gap (EBAG) according to exemplary embodiments of the present teachings, in which:

FIG. 1 is a side view of a metallization layer in accordance with one or more embodiments;

FIG. 2 is an enlarged side view of the metallization layer with impregnated metallic interconnect materials;

FIG. 3 is a side view of a metallization layer following air exposure and deposition of removable layer and hard mask in accordance with one or more embodiments;

FIG. 4 is an enlarged side view of a cobalt (Co) or ruthenium (Ru) cap of the metallization layer of FIG. 2 in accordance with one or more embodiments;

FIG. 5 is an enlarged view of the metallization layer of FIG. 2 without a cobalt (Co) or ruthenium (Ru) cap in accordance with one or more embodiments;

FIG. 6 is a side view of an annealing process in accordance with one or more embodiments;

FIG. 7 is an enlarged side view of a structure resulting from the annealing process of FIG. 6;

FIG. 8 is a side view of an application of a litho-stack in accordance with one or more embodiments;

FIG. 9 is a side view of a pattern transfer process of a litho-stack in accordance with one or more embodiments;

FIG. 10 is a side view of dielectric layer damage in accordance with one or more embodiments;

FIG. 11 is a side view of damaged dielectric layer removal in accordance with one or more embodiments;

FIG. 12 is a side view of an application of a capping layer in accordance with one or more embodiments;

FIG. 13 is an enlarged side view of an individual air gap in accordance with one or more embodiments;

FIG. 14 is a flow diagram illustrating a method of forming a self-forming barrier (SFB) of a metallization layer in accordance with one or more embodiments; and FIG. 15 is a flow diagram illustrating a method of forming a self-forming barrier (SFB) of a metallization layer in accordance with one or more embodiments.

DETAILED DESCRIPTION

Figure 1:
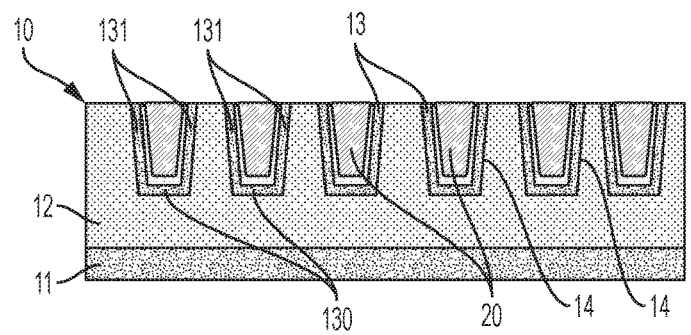

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies relevant to embodiments of the present invention, as copper usage progressed, additive patterning or "damascene" or "dual-damascene" processing has been developed. These processes are analogous to traditional metal inlaying processes. That is, an underlying silicon oxide insulating layer is patterned with open trenches where the conductor should be. A thick coating of copper that significantly overfills the trenches is deposited on the insulator, and chemical-mechanical planarization (CMP) is used to remove the copper extending above the top of the insulating layer. Copper sunken within the trenches of the insulating layer is not removed and becomes the patterned conductor. With successive layers of insulator and copper, a multilayer interconnection structure can be created.

Recently, device scales have been reduced substantially with the result being that interconnect resistivity/capacitance (RC) became dominant propagation delay components. Thus, air gaps have been designed into devices in order to reduce capacitance problems. However, when resistance also needs to be reduced, air gap technology needs to be applied in copper metallization. This leads to further problems in that air gap formation processes cause copper diffusion barrier layers and top surfaces to be damaged. For example, air gap formation often requires removal of dielectrics between copper lines but the removal is conducted using plasma or chemical processes that attack barrier metal layers.

Turning now to an overview of the present invention, one or more embodiments relate to protecting top copper surfaces and copper sidewalls/barrier layers using barrier materials including manganese (Mn). Such materials can include, but are not limited to, tantalum manganese oxide (TaMnO) and manganese silicon oxide (MnSiO3). The materials are generally immune to chemical or plasma attacks and thus remain intact during air gap formation processes. The manganese can be supplied from the copper seed layer, from plasma vapor deposition (PVD) processing, from atomic layer deposition (ALD) processing or from chemical vapor deposition (CVD) processing.

An etch back air gap (EBAG) process is utilized to create air gaps in interconnects with very small spacing, while allowing more relaxed lithography for air gap patterning. As will be described below, the EBAG process satisfies requirements for protection of metallic interconnect materials that would otherwise be attacked and damaged by air gap formation processes.

With reference to FIG. 1, the EBAG process includes an initial process stage during which an initial structure 10 is formed. The initial structure 10 includes a semiconductor substrate 11, a dielectric layer 12 and a liner 13. The dielectric layer 12 is formed of ultra low-k dielectric (ULK) material and is disposed on an upper layer of the semiconductor substrate 10. The dielectric layer 12 is formed to define one or more trenches 14 that extend inwardly from an uppermost surface of the dielectric layer 12. Each trench 14 has a bottom trench surface and trench sidewalls that taper inwardly from the uppermost surface of the dielectric layer 12 such that the trenches 14 have relatively wide upper portions and relatively narrow lower portions. The liner 13 can be formed of tantalum (Ta), tantalum nitride (TaN), cobalt (Co) or ruthenium (Ru) or a combination thereof and is disposed to line each of the trenches 14. The liner 13 in each trench 14 thus includes a bottom liner portion 130 that lines the bottom trench surface and liner sidewalls 131 that line the trench sidewalls.

The initial structure 10 further includes metallic interconnect material 20 that has been impregnated with dopant materials 21. The metallic interconnect material 20 can include copper (Cu) and fills a remainder of the space within each of the trenches 14 that is not occupied by the liner 13.

Figure 2:
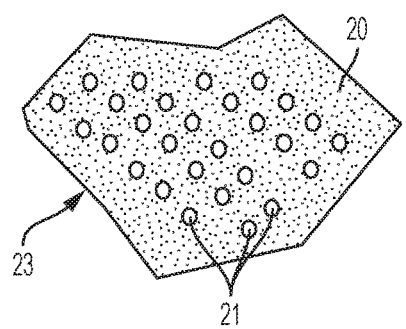

With reference to FIG. 2, the dopant materials 21 can include manganese (Mn) atoms or particles that are suspended within the metallic interconnect materials 20. In such cases, the manganese can be supplied from a manganese copper seed layer, which is removed along with upper sections of the liner 13 by chemical mechanical polishing (CMP) processes. The dopant materials 21 are utilized to form a layer that is immune from chemical attacks or from plasma attacks such that when portions of the dielectric layer 12 are removed the metallic interconnect material 20 can be protected from damage that would otherwise result from the removal of the portions of the dielectric layer 12.

While FIG. 2 illustrates one or more embodiments for providing the dopant materials 21, it is to be understood that one or more other embodiments exist. Some of these other embodiments will be discussed in greater detail below. In any case, once the trenches 14 are lined and filled with the metallic interconnect material 20 that is impregnated with the dopant materials 21 (i.e., the impregnated metallic interconnect material 23), the initial structure 10 is formed into an intermediate structure 30 (see FIG. 3).

Figure 3:
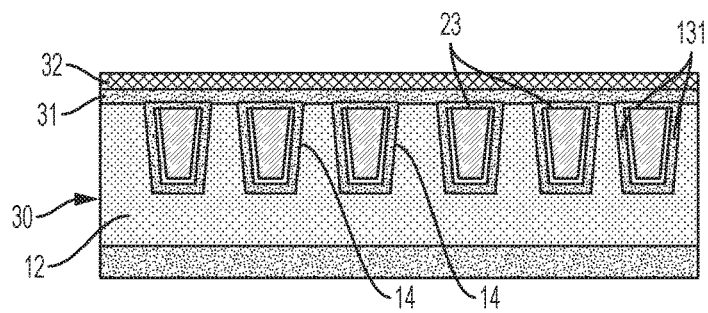

With reference to FIG. 3, the intermediate structure 30 is exposed to air for about two hours and covered by a removable layer 31 and a hard mask 32. The removable layer 31 is effectively laid down over the exposed portions of the dielectric layer 12, the terminal ends of each of the liner sidewalls 131 for each of the trenches 14 and the impregnated metallic interconnect materials 23 filling the remainders of each of the trenches 14. The hard mask 32 can be provided as a low temperature oxide (LTO) and is laid down over the removable layer 31.

Figure 4:
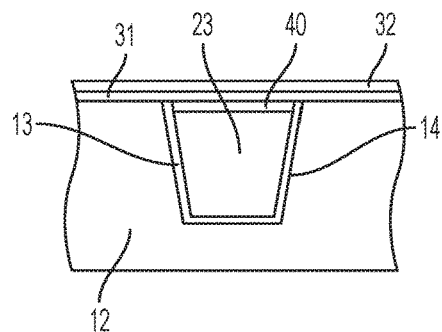

With reference to FIG. 4, a cap 40 can be laid down onto uppermost surfaces of the impregnated metallic interconnect materials 23 filling the remainders of each of the trenches 14. The cap 40 can be formed of tantalum (Ta), tantalum nitride (TaN), cobalt (Co) or ruthenium (Ru) and is thus interposed between the uppermost surfaces of the impregnated metallic interconnect materials 23 and the proximal portions of the lower surface of the removable layer 31.

Figure 5:
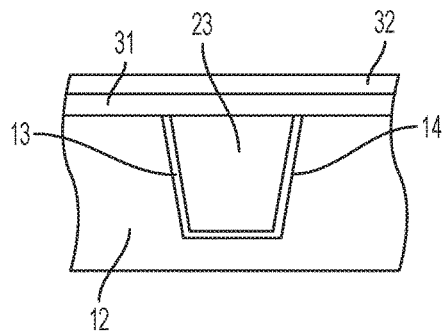

With reference to FIG. 5, some embodiments exist in which no cap is presented. In such cases, the proximal portions of the lower surface of the removable layer 31 are laid down over and in direct contact with the uppermost surfaces of the impregnated metallic interconnect materials 23 filling the remainders of each of the trenches 14.

Figure 6:
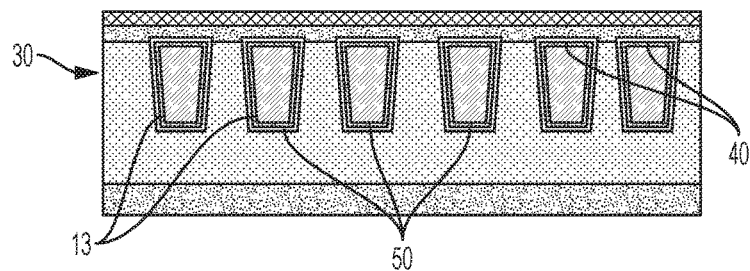

With reference to FIG. 6, drive-out annealing of the intermediate structure 30 is conducted to drive the dopant materials 21 out of the impregnated metallic interconnect materials 23 and through the liner 13 and the cap 40 (where applicable). The drive-out annealing includes a timed, controlled heating of the intermediate structure 30 and can include heating the intermediate structure 30 to a non-damage inducing temperature at which the other components of the intermediate structure 30 are not heat affected or damaged for a predefined time that is derived from multiple factors including a thickness of the liner 13 and a concentration of the dopant materials 21 in the metallic interconnect material 20. For example, the drive-out annealing can include heating the intermediate structure 30 to a temperature of about 400° C. for about one hour.

Figure 7:
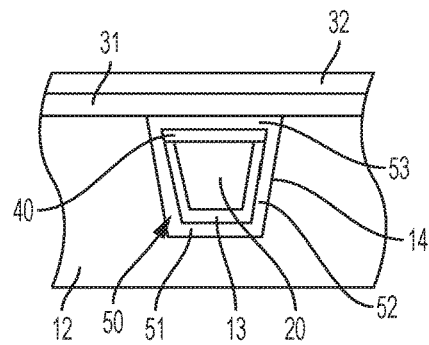

In any case, with reference to FIG. 7 (which is drawn to include an illustration of the cap 40 for exemplary purposes), the drive-out annealing results in the formation of a self-forming layer 50 (e.g., a tCoSFB or a tRuSFB) that includes the dopant materials 21 at an exterior of the liner 13 in each trench 14. Thus, in each trench 14, the self-forming layer 50 includes manganese (Mn) configured to surround the metallic interconnect material 20. In particular, in each trench 14, the self-forming layer includes the manganese (Mn) configured to form a bottom SFB wall 51 that runs generally along the bottom trench wall, SFB sidewalls 52 that run generally along the trench sidewalls and an upper SFB wall 53 that runs along the lower surface of the removable layer 31 and the uppermost surface of the metallic interconnect material 20, which is no longer impregnated with the dopant materials 21.

With the formation of the self-forming layer 50 completed, the intermediate structure 30 will be referred to as a secondary intermediate structure 60 in the following description.

Figure 8:
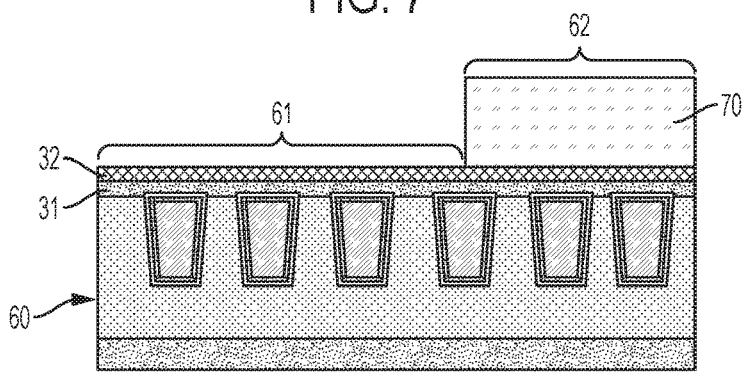

With reference to FIG. 8, a lithography stack 70 (or a litho-stack) is applied to a portion of an upper surface of the hard mask 32 of the secondary intermediate structure 60. The portion of the upper surface of the hard mask 32 is remote from a location where an air gap is desired to be formed and patterned for a given application. That is, if an air gap is desired to be formed and patterned in first region 61 of the secondary intermediate structure 60, the portion of the upper surface of the hard mask 32 where the lithography stack 70 is applied is associated with second region 62. The lithography stack 70 can include one or more suitable materials, such as an organic planarization layer and photo resist.

Figure 9:
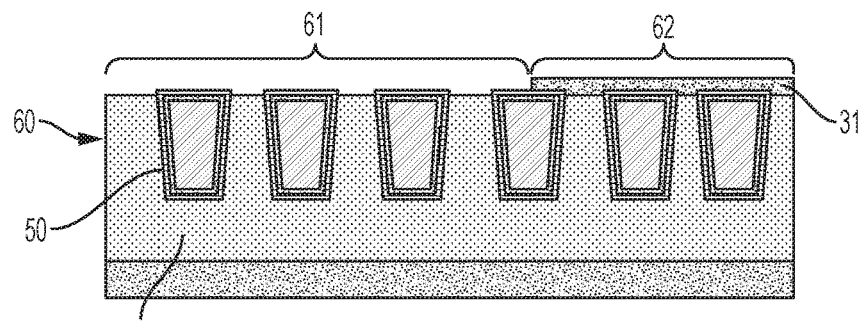

With reference to FIG. 9, once the lithography stack 70 is applied, a pattern transferring process is executed to expose the portion of the secondary intermediate structure 60 within the first region 61. The pattern transferring process can include a reactive ion etch (RIE), for example, and results in the removal of the lithography stack 70, the hard mask 32 and the portion of the removable layer 31 associated with the first portion 61. Thus, the pattern transferring process exposes respective upper surfaces of the dielectric layer 12 and the self-forming layer 50 at each of the trenches 14 that are in turn associated with the first portion 61.

Figure 10:
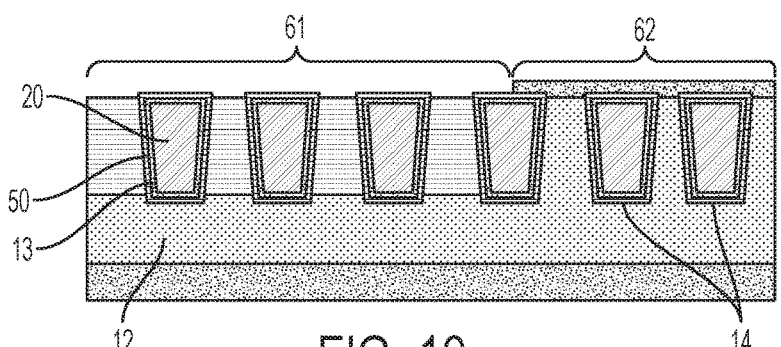

With reference to FIG. 10, a next process involves intentionally damaging the dielectric layer 12 in the first portion 61 so that the material of the damaged dielectric layer 12 can be removed. The damage can be caused by exposure of the secondary intermediate structure 60 to chemical or plasma attacks that break down the material of the dielectric layer 12

(e.g., the ULK of the dielectric layer 12). However, since the self-forming layer 50 is immune to the chemical or plasma attacks and the self-forming layer 50 surrounds the metallic interconnect material 20 and the liner 13 in each trench 14, the metallic interconnect material 20 is protected from the chemical or plasma attacks and is thus undamaged by the process of intentionally damaging the dielectric layer 12.

As shown in FIG. 10, the duration and strength of the process of intentionally damaging the dielectric layer 12 in the first portion 61 can be provided such that the damage extends through the dielectric layer 12 to respective plane(s) of the bottom trench surfaces. However, it is understood that this need not be the case and that the damage can be halted above or below this plane. In the former case, the metallic interconnect material 20, the liner 13 and the self-forming layer 50 of each former trench 14 would continue to reside in a shallow trench. In the latter case, the metallic interconnect material 20, the liner 13 and the self-forming layer 50 of each former trench 14 could be supported on a remaining pedestal of damaged or undamaged material of the dielectric layer 12.

Figure 11:
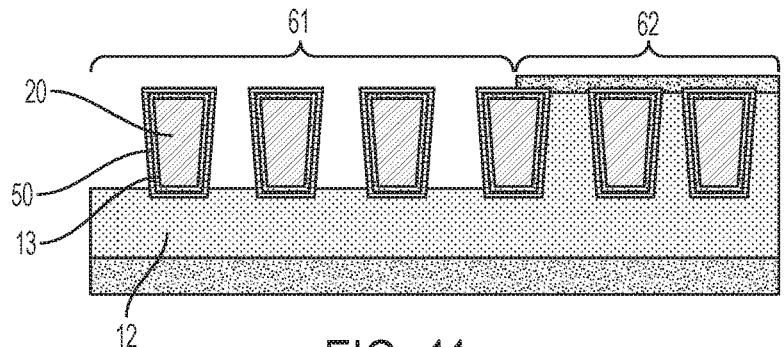

In any case, with reference to FIG. 11, the damaged material of the dielectric layer 12 in the first portion 61 is removed by a wet etch process. Such removal results in air gaps being formed between the metallic interconnect material 20, the liner 13 and the corresponding self-forming layers 50 of each of the former trenches 14 in the first portion 61.

Figure 12:
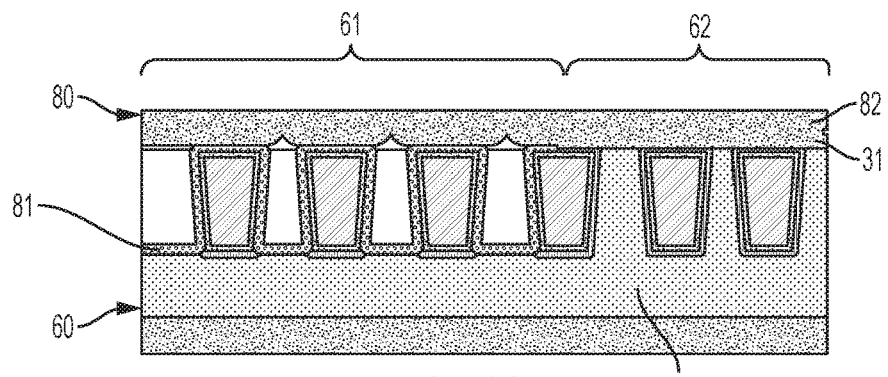

At this point, with reference to FIG. 12, a dielectric capping stack 80 is applied to the secondary intermediate structure 60 for further air gap processing. As shown in FIG. 12, the dielectric capping stack 80 can include a conformally deposited capping material 81 as well as a layer of non-conformally deposited dielectric materials 82. The conformally deposited capping material 81 can be formed by CVD, PVD and/or ALD processing and can run along upper surfaces of the dielectric layer 12 and the exposed exterior surfaces of the self-forming layer 50 in the first portion 61. The layer of non-conformally deposited dielectric materials 82 can be laid down after the conformally desposited capping material 81 is formed and can extend across an entirety of the secondary intermediate structure 60 such that a lower surface of the layer of non-conformally deposited dielectric materials 82 lies atop the portion of the removable layer 31 in the second portion 62 and atop the uppermost sections of the conformally deposited capping material 81.

Figure 13:
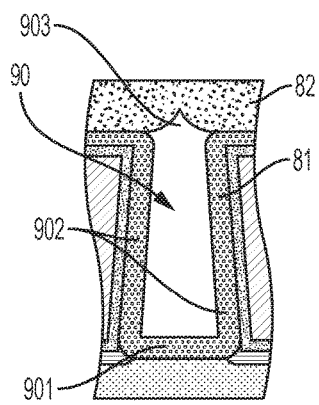

With reference to FIG. 13, the resulting formation of an individual air gap 90 is illustrated. As shown in FIG. 13, the individual air gap 90 is bordered by the comformally deposited capping material 81 at a lower end 901 thereof and along tapered sides 902 thereof. At the upper end 903 of the individual air gap 90, the individual air gap 90 is bordered by the non-conformally deposited dielectric materials 82, which can be configured as a pointed ceiling.

A semi-conductor device is thus provided as shown in FIG. 12 and in FIG. 13. The semi-conductor device includes the semi-conductor substrate 11 and the dielectric layer 12, which has the first portion 61 defining an empty region and a second portion 62 defining a trench 14. The semi-conductor device further includes first and second metallic interconnects respectively disposed within the empty region in the first portion 61 and in the trench 14 in the second portion 62, a self-forming layer 50 and a capping layer 80. Each of the first and second interconnects includes metallic interconnect material 20 and a liner 13 disposed to surround portions of the metallic interconnect material 20. The self-forming layer 50, which is formed of chemical- and plasma-attack immune material, is disposed on surfaces of the first and second interconnects in the first and second portions 61 and 62 and on surfaces of the dielectric layer 12 in the first portion 61. The capping layer 80 is disposed on the dielectric layer 12 to define air gaps 90 with the self-forming layer 50 in the first portion 61.

The self-forming layer 50 can include manganese (Mn) and the liner 13 can include tantalum (Ta), tantalum nitride (TaN), cobalt (Co) or ruthenium (Ru). A cap 40 can be interposed between respective upper surfaces of the first and second interconnects and the self-forming layer 50. The air gaps 90 can have tapered sides and a pointed ceiling.

Figure 14:
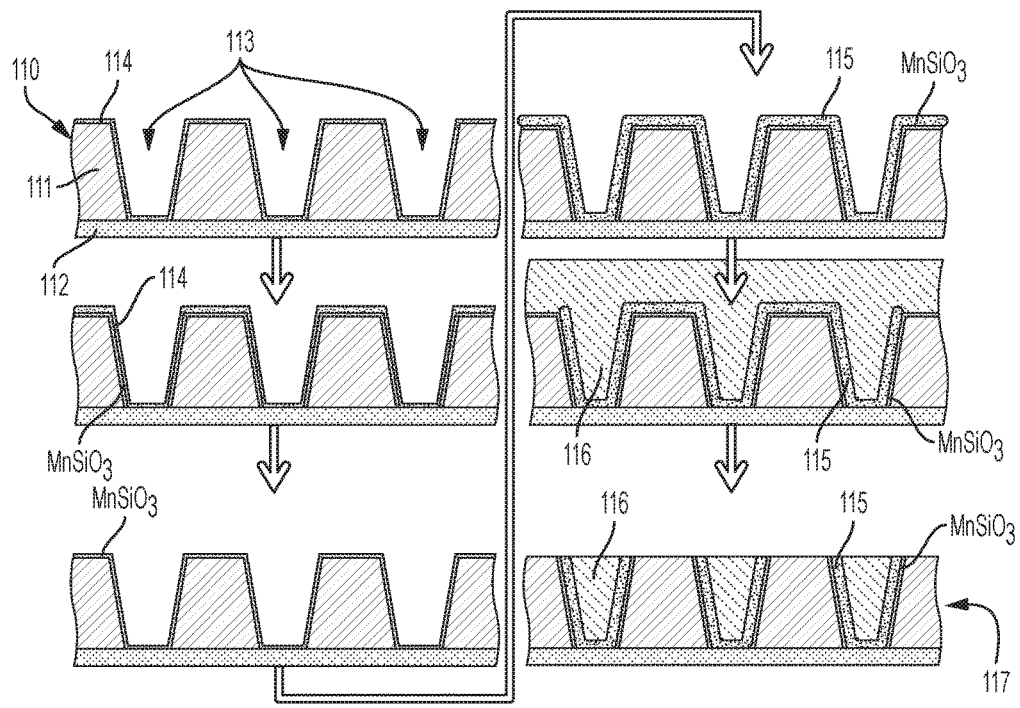

With reference to FIG. 14, a process of forming an EBAG is provided in accordance with one or more embodiments. The process will be described in detail below but it is to be understood that features of the process that are similar to those described above need not be and will not be re-described in a same level of detail. As shown in FIG. 14, the process includes forming an initial structure 110 that includes a dielectric layer 111, which is disposed on a substrate 112 and which is formed to define trenches 113. The process further includes lining the trenches 113 with liner materials 114 and then lining the liner materials 114 with an additional liner 115. The lining of the trenches 113 with the liner materials 114 can include ALD processing of manganese nitride (MnN), rapid thermal processing (e.g., at about 400° C.) of the MnN to form a barrier layer of manganese silicon oxide ($MnSiO_3$) and stripping remaining MnN. The lining of the liner materials 114 with the additional liner 115 can include CVD processing of the additional liner 115. As above, the liner materials 114 can include manganese (Mn) and the additional liner 115 can include cobalt (Co) or ruthenium (Ru). Finally, the process includes filling a remainder of each of the trenches 113 with metallic interconnect materials 116 to form a resulting intermediate structure 117 following planarization. This resulting intermediate structure 117 can be further processed as discussed above with reference to FIGS. 8-12.

Figure 15:
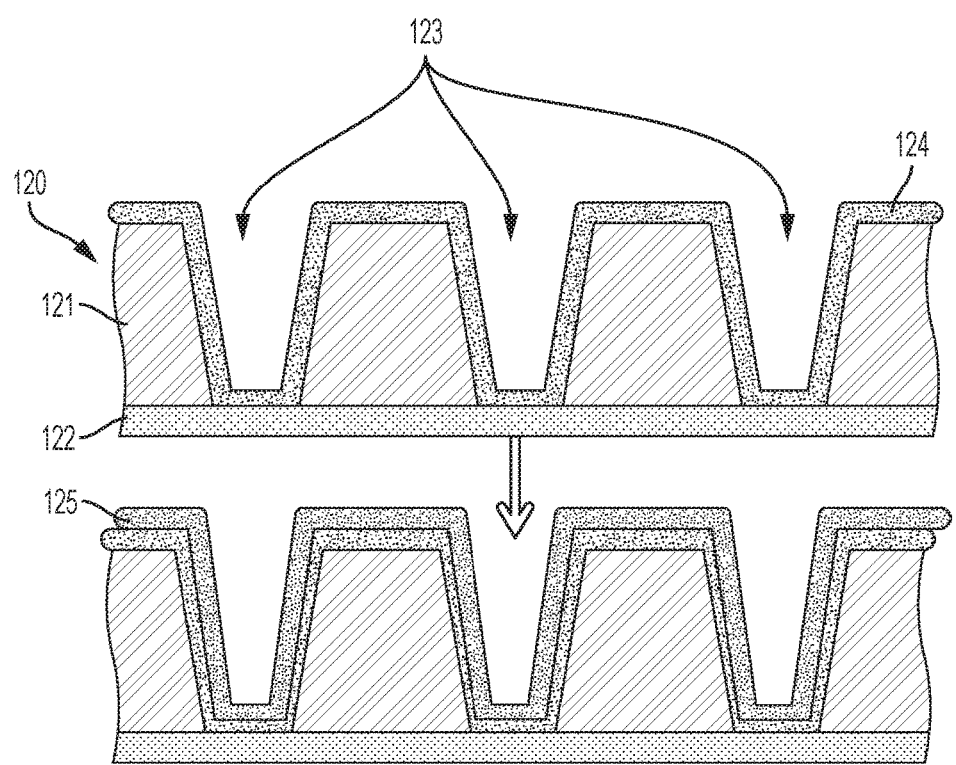

With reference to FIG. 15, a process of forming an EBAG is provided in accordance with one or more embodiments. The process will be described in detail below but it is to be understood that features of the process that are similar to those described above need not be and will not be re-described in a same level of detail. As shown in FIG. 15, the process includes forming an initial structure 120 that includes a dielectric layer 121, which is disposed on a substrate 122 and which is formed to define trenches 123. The process further includes lining the trenches 123 with a liner 124 and then lining the liner 124 with additional liner materials 125. The lining of the trenches 123 with the liner 124 can include CVD processing of the liner 124 such that the liner 124 includes tantalum (Ta), tantalum nitride (TaN), cobalt (Co) and/or ruthenium (Ru). The lining of the liner 124 can include ALD or CVD processing of manganese nitride (MnN) as the additional liner materials 125. Next, the process includes filling a remainder of each of the trenches 123 with metallic interconnect materials to form a resulting intermediate structure following planarization that is similar to the resulting intermediate structure 117 of FIG. 14. This resulting intermediate structure can then be exposed to drive-out annealing, which is similar to the drive-out annealing described above, to drive the additional liner materials 125 through the liner 124 such that they form a self-forming layer as described above. The resulting intermediate structure can be further processed as discussed above with reference to FIGS. 8-12.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An etch back air gap (EBAG) process, comprising:
    forming an initial structure comprising a dielectric layer disposed on a substrate and a liner disposed to line a trench defined in the dielectric layer;
    impregnating a metallic interconnect material with dopant materials;
    filling a remainder of the trench with the impregnated metallic interconnect materials to form an intermediate structure;
  drive-out annealing of the intermediate structure to drive the dopant materials out of the impregnated metallic interconnect materials and thereby form a chemical- and plasma-attack immune material; and
    exposing and covering the intermediate structure prior to the drive-out annealing by exposing the intermediate structure to air, laying down a removable layer over the dielectric layer, the liner and the impregnated metallic interconnect materials and laying down a hard mask over the removable layer.

2. The EBAG process according to claim 1, wherein the dopant materials comprise manganese (Mn).

3. The EBAG process according to claim 1, wherein the drive-out annealing comprises timed, controlled heating of the intermediate structure.

4. The EBAG process according to claim 3, wherein the timed, controlled heating comprises heating the intermediate structure to a non-damage inducing, drive-out temperature for a predefined time.

5. The EBAG process according to claim 1, further comprising laying down a cap over the impregnated metallic interconnect material, the cap comprising tantalum (Ta), tantalum nitride (TaN), cobalt (Co) or ruthenium (Ru).

6. The EBAG process according to claim 1, wherein the exposing and covering comprises laying down the removable layer and the hard mask directly onto the impregnated metallic interconnect material.

7. The EBAG process according to claim 1, wherein the liner comprises tantalum (Ta), tantalum nitride (TaN), cobalt (Co) or ruthenium (Ru).

8. The EBAG process according to claim 1, wherein the exposing and covering comprises laying down the removable layer and the hard mask directly onto the impregnated metallic interconnect material and the liner comprises tantalum (Ta), tantalum nitride (TaN), cobalt (Co) or ruthenium (Ru).

9. An etch back air gap (EBAG) process, comprising:
    forming an initial structure comprising a dielectric layer disposed on a substrate and a liner disposed to line a trench defined in the dielectric layer;
    impregnating a metallic interconnect material with dopant materials;
    filling a remainder of the trench with the impregnated metallic interconnect materials to form an intermediate structure;
    drive-out annealing of the intermediate structure to drive the dopant materials out of the impregnated metallic interconnect materials and thereby form a chemical- and plasma-attack immune material; applying a litho-stack for air gap processing to the intermediate structure;
    pattern transferring to expose a portion of the intermediate structure;
    removing the dielectric layer in the portion of the intermediate structure; and
    applying a dielectric capping stack for air gap processing to the intermediate structure.

10. The EBAG process according to claim 9, wherein the removing comprises damaging and etching the dielectric layer in the portion of the intermediate structure.

11. An etch back air gap (EBAG) process, comprising:
    forming an initial structure comprising a dielectric layer disposed on a substrate and formed to define a trench;
    lining the trench with a liner;
    lining the liner with dopant materials;
    filling a remainder of the trench with metallic interconnect materials to form an intermediate structure; and
    drive-out annealing of the intermediate structure to drive the dopant materials through the liner,
    wherein:
    the lining of the trench comprises chemical vapor deposition (CVD) processing of tantalum (Ta), tantalum nitride (TaN), cobalt (Co) or ruthenium (Ru), and
    the lining of the liner comprises atomic layer deposition (ALD) or CVD processing of manganese nitride (MnN).

12. The EBAG process according to claim 11, wherein the dopant materials comprise manganese (Mn) and the liner comprises tantalum (Ta), tantalum nitride (TaN), cobalt (Co) or ruthenium (Ru).

13. The EBAG process according to claim 11, wherein the drive-out annealing comprises heating the intermediate structure to a non-damage inducing, drive-out temperature for a predefined time.

14. An etch back air gap (EBAG) process, comprising:
    forming an initial structure comprising a dielectric layer disposed on a substrate and formed to define a trench;
    lining the trench with a liner;
    lining the liner with dopant materials;
    filling a remainder of the trench with metallic interconnect materials to form an intermediate structure;
    drive-out annealing of the intermediate structure to drive the dopant materials through the liner;
    planarizing an upper surface of the intermediate structure;
    applying a litho-stack for air gap processing to the intermediate structure;
    pattern transferring to expose a portion of the intermediate structure;
    removing the dielectric layer in the portion of the intermediate structure; and
    applying a dielectric capping stack for air gap processing to the intermediate structure.

* * * * *